(12) United States Patent
Körner

(10) Patent No.: US 6,812,801 B2
(45) Date of Patent: Nov. 2, 2004

(54) CRYSTAL OSCILLATOR CIRCUIT HAVING CAPACITORS FOR GOVERNING THE RESONANT CIRCUIT

(75) Inventor: Heiko Körner, Söding (AT)

(73) Assignee: Infineon Technologies AG, Munich (DE)

( * ) Notice: Subject to any disclaimer, the term of this patent is extended or adjusted under 35 U.S.C. 154(b) by 6 days.

(21) Appl. No.: 10/324,822

(22) Filed: Dec. 20, 2002

(65) Prior Publication Data

US 2003/0117224 A1 Jun. 26, 2003

(30) Foreign Application Priority Data

Dec. 20, 2001 (DE) .......................................... 101 62 912

(51) Int. Cl.[7] ................................................ H03B 5/32
(52) U.S. Cl. ..................................... 331/158; 331/36 C
(58) Field of Search ............................. 331/158, 36 C, 331/117 R, 116 R

(56) References Cited

U.S. PATENT DOCUMENTS

| | | | | |
|---|---|---|---|---|
| 4,894,561 A | * | 1/1990 | Nogami ....................... | 326/27 |
| 5,202,647 A | | 4/1993 | Muraki et al. ................ | 331/74 |
| 5,528,201 A | | 6/1996 | Davis ................... | 331/116 FE |
| 5,745,012 A | * | 4/1998 | Oka et al. ..................... | 331/68 |
| 6,559,730 B1 | * | 5/2003 | Marvin et al. .............. | 331/158 |

FOREIGN PATENT DOCUMENTS

| | | |
|---|---|---|
| DE | 39 18 061 A1 | 12/1990 |
| EP | 1 143 606 A1 | 10/2001 |
| GB | 1 424 559 | 2/1976 |
| JP | 59 188 203 | 10/1984 |
| JP | 09 102 714 | 4/1997 |
| JP | 2000 223 948 | 8/2000 |

OTHER PUBLICATIONS

Kenneth R. Burch: "Method To Reduce RFI In A CMOS Pierce Crystal Oscillator", *Motorola Technical Developments*, vol. 10, Mar. 1990, p. 82, XP–000114660.

Tietze et al.: "Halbleiter–Schaltungstechnik" [Semiconductor Circuitry], Ed. 10, 1993, pp. 466–469.

\* cited by examiner

*Primary Examiner*—Robert Pascal
*Assistant Examiner*—Joseph Chang
(74) *Attorney, Agent, or Firm*—Laurence A. Greenberg; Werner H. Stemer; Ralph E. Locher

(57) ABSTRACT

A crystal oscillator circuit has capacitors that govern the resonant circuit and are designed such that they can be connected and disconnected, for frequency adjustment. A respective compensation capacitor is connected opposite and in mirror-image form to these capacitors that govern the resonant circuit. This compensation capacitor influences only the dynamic operating point, but has virtually no effect on the oscillation frequency. In consequence, it is not possible to shift the operating point during adjustment of the oscillation frequency, thus ensuring stability of the oscillating system and operation at the desired operating point.

9 Claims, 2 Drawing Sheets

CRYSTAL OSCILLATOR CIRCUIT HAVING CAPACITORS FOR GOVERNING THE RESONANT CIRCUIT

BACKGROUND OF THE INVENTION

Field of the Invention

The following invention relates to a crystal oscillator circuit.

Crystal oscillators are electrical systems that can oscillate with a better frequency constancy than LC oscillators. In this case, crystals mechanically oscillate by being stimulated by electrical fields. An oscillating crystal having connected electrodes electrically behaves like a high Q-factor resonant circuit.

A so-called Pierce oscillator, which is representative of fundamental frequency oscillators, has two capacitors forming a series resonant circuit that is stimulated by an amplifier. In this case, a complementary metal oxide semiconductor (CMOS) inverter is used, for example, as the amplifier. A Pierce oscillator such as this is specified, for example, in the Tietze, Schenk: Halbleiter-Schaltungstechnik, [Semiconductor circuit technology] 10th Edition, 1993, on pages 466–469. In the Pierce oscillator, one of the two capacitors is designed to be adjustable. The oscillation frequency of the resonant circuit is influenced by adjusting the series capacitor. However, frequency adjustment using capacitors can also be carried out, for example, by connecting or disconnecting capacitor elements in discrete steps.

In crystal oscillators such as these, in which frequency adjustment is carried out using capacitors that are connected to ground, it is possible for the operating point to be shifted so far that the phase reserve of the system that can oscillate is no longer adequate, and the system becomes unstable. Instability such as this is disadvantageous in particular in the case of oscillators that have amplitude regulation.

SUMMARY OF THE INVENTION

It is accordingly an object of the invention to provide a crystal oscillator circuit having an improved stability response.

With the foregoing and other objects in view there is provided, in accordance with the invention a crystal oscillator circuit including: an oscillating crystal having a first and a second connection; a quick-response amplifier having an input connected to the first connection of the oscillating crystal and an output connected to the second connection of the oscillating crystal; a device for operating point adjustment, the device coupling the oscillating crystal to the input of the quick-response amplifier; a reference node; a first capacitive component for connecting the first connection of the oscillating crystal to the reference node; a second capacitive component for connecting the second connection of the oscillating crystal to the reference node; and a compensation capacitor connected to the input of the quick-response amplifier and to the reference node. The first capacitive component and/or the second capacitive component is adjustable. The compensation capacitor is adjustable in a complementary manner to the first capacitive component and the second capacitive component.

In accordance with an added feature of the invention, the first capacitive component includes a plurality of capacitive components connected in parallel; the second capacitive component includes a plurality of capacitive components connected in parallel; the plurality of the capacitive components of the first capacitive component and the plurality of the capacitive components of the second capacitive component are connectable and disconnectable in pairs independently of one another; the compensation capacitor includes a plurality of capacitive components connected in parallel; and each one of the plurality of the capacitive components of the first capacitive component is associated with a respective one of the plurality of the capacitive components of the compensation capacitor.

In accordance with an additional feature of the invention, each one of the plurality of the capacitive components of the first capacitive component and the respective one of the plurality of the capacitive components of the compensation capacitor associated therewith has a fixed capacitance ratio.

In accordance with another feature of the invention, the plurality of the capacitive components of the compensation capacitor can be connected and disconnected independently of one another.

In accordance with a further feature of the invention, there is provided, a plurality of switches; and a drive circuit. Each one of the plurality of the capacitive components of the first capacitive component, the plurality of the capacitive components of the second capacitive component, and the plurality of the capacitive components of the compensation capacitor are coupled to a respective one of the plurality of the switches enabling connection and disconnection thereof. Each one of the plurality of the switches has a control connection. The drive circuit supplies control signals in a non-inverted form to the control connections of ones of the plurality of the switches connected to the plurality of the capacitive components of the first capacitive component. The drive circuit supplies control signals in a non-inverted form to the control connections of ones of the plurality of the switches connected to the plurality of the capacitive components of the second capacitive component. The drive circuit supplies control signals in an inverted form to the control connections of ones of the plurality of the switches connected to the plurality of the capacitive components of the compensation capacitor.

In accordance with a further added feature of the invention, the first capacitive component has a capacitance value; the compensation capacitor has a capacitance value; and a quotient of the capacitance value of the first capacitive component and the capacitance value of the compensation capacitor is greater than 5.

In accordance with another added feature of the invention, a minimum value capacitor permanently connects the input of the quick-response amplifier to the reference node.

In accordance with yet an added feature of the invention, the quick-response amplifier is an inverter.

In accordance with yet an additional feature of the invention, the quick-response amplifier is a CMOS inverter.

In accordance with yet another feature of the invention, the device for operating point adjustment is a resistor.

According to one development of the Pierce oscillator and in the case of the described principle, the oscillation frequency of the oscillator is adjusted by connecting or disconnecting the first and second capacitive component. The introduction of a compensation capacitor makes it possible for the oscillator circuit to maintain a stable response. The compensation capacitor is decoupled from the actual resonant circuit by the device for operating point adjustment, so that the connection or disconnection of the compensation capacitor admittedly has the desired effect on the operating point of the quick-response amplifier, but not on the actual oscillation frequency of the crystal oscillator circuit.

The compensation capacitor is adjusted opposite and in mirror-image form to the first and second capacitive component. This means that the compensation capacitor is disconnected when the first and second capacitive component is connected, and vice versa. With a suitable design, this results in the maintenance of the operating point of the quick-response amplifier. The compensation capacitor accordingly affects only the dynamic operating point of the quick-response amplifier.

According to one advantageous development of the invention, a number of first and a number of second capacitive components are provided. In this case, the number of first capacitive components are connected in parallel with one another. The number of second capacitive components are likewise connected in parallel with one another.

Since the first and second capacitive components can each be connected and disconnected, the parallel circuits preferably each include a series circuit of a switch and of one of the number of first or second capacitive components.

The number of first and the number of second capacitive components are preferably provided in pairs. In this case, one first and one second capacitive component are in each case connected or disconnected at the same time.

The large number of capacitive components allows the frequency at which the oscillating crystal is oscillating to be adjusted in any desired number of steps.

In this case, each pair including a first and a second capacitive component preferably has a respectively associated compensation capacitor. The compensation capacitor in each case has a fixed capacitance ratio with respect to the associated first and second capacitive component, in this case. According to the present principle, in each case one pair of first and second capacitive components are switched at the same time at the associated compensation capacitor, but in the opposite sense and in mirror-image form. This means that, when one pair including a first and a second capacitive component is connected, the compensation capacitor which is associated with this pair and which has a fixed capacitance ratio with respect to the two components is disconnected. With a suitable design, the proposed principle makes it possible first to ensure a simple layout of a crystal oscillator circuit, and second to achieve an exact compensation for the dynamic operating point of the quick-response amplifier.

In order to make it possible to switch associated capacitors in the opposite sense and in mirror-image form, a drive circuit is preferably provided which supplies a control signal in a non-inverted form to the control connections of the switches which are respectively associated with the first and second capacitive components. The switch that is connected to the compensation capacitor that is associated with the pair of first and second capacitive components is supplied with this control signal in inverted form at its control connection. This results in the opposite switching, in mirror-image form, on which the present principle is based, of the compensation capacitor with regard to the first and second capacitive components.

The capacitor values of the first and second capacitive components are preferably very much greater than the capacitive value of their associated, compensating capacitive component. The capacitor values of the first and second capacitive component, which jointly form a pair, are in this case preferably the same. The quotient of the capacitor value of the first capacitive component and the capacitor value of the associated compensation capacitor is preferably greater than 5.

As an improvement, this ensures that the connection or disconnection of compensation capacitors influences only the dynamic operating point of the quick-response amplifier, but not the oscillation frequency of the crystal oscillator itself.

According a further advantageous embodiment of the present invention, a minimum value capacitor is provided, which permanently connects the input of the quick-response amplifier to the reference node.

Together with the device for operating point adjustment, which is preferably in the form of a resistor, the minimum value capacitor forms an RC element, which has low-pass filter characteristics. A low-pass filter such as this advantageously assists the stability of the crystal oscillator circuit.

The described crystal oscillator circuit is preferably constructed as an integrated circuit using complementary metal oxide semiconductor (CMOS) circuit technology.

The quick-response amplifier is preferably formed as a CMOS inverter.

Other features which are considered as characteristic for the invention are set forth in the appended claims.

Although the invention is illustrated and described herein as embodied in a crystal oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
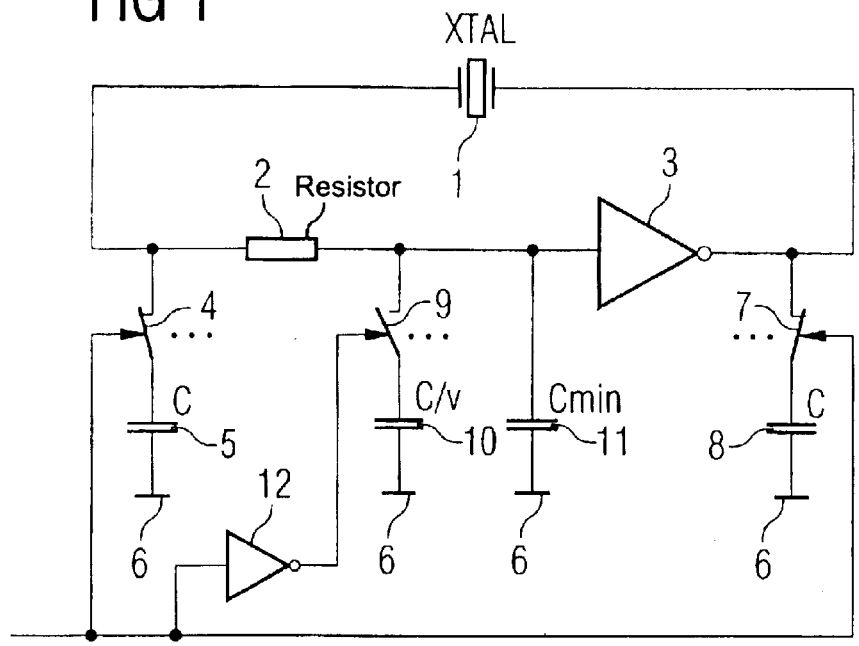
FIG. 1 is a simplified circuit diagram of a first embodiment of a crystal oscillator circuit.

Referring now to the figures of the drawing in detail and first, particularly, to FIG. 1 thereof, there is shown a crystal oscillator circuit including an oscillating crystal 1 with two connections. The first connection of the oscillating crystal 1 is connected, via a resistor 2, to one input of an inverter 3. One output of the inverter 3 is connected to the second connection of the oscillating crystal 1. One connection of a series circuit including a switch 4 and a capacitor 5 is connected to the node between the oscillating crystal 1 and the resistor 2. Another connection of the series circuit is connected to a reference node 6, which is connected to reference-ground potential. A further series circuit, which includes a switch 7 and a capacitor 8 having the same capacitor value as the capacitor 5, is connected between the output of the inverter 3 and the reference node 6. One connection of a series circuit including a switch 9 and a compensation capacitor 10 is connected to the reference node 6. The other connection of the series circuit is connected to the input of the inverter 3, specifically between the resistor 2 and the inverter 3. A minimum value capacitor 11 is connected from the reference node 6 in parallel with the immediately previously described series circuit including the switch 9 and the compensation capacitor 10. Together with the resistor 2, the minimum value capacitor 11 forms an RC element, which acts as a low-pass filter.

The switches 4, 7, which effectively connect and disconnect a first capacitive component, namely the capacitor 5 and a second capacitive component, namely the capacitor 8, are each switched at the same time by the same drive signal since their control connections are connected to one another. The switch 9 associated with the compensation capacitor 10 is switched in inverted form, for which purpose an inverter 12, which is supplied with the drive signal, is connected to the control connection of the switch 9. The input of the inverter 12 is connected to the control connections of the switches 4, 7, which are associated with the first and second capacitive components 5, 8, respectively. Accordingly, the switch 9 closes when the switches 4 and 7 open, and vice versa.

First and second capacitive components 5, 8 are each connected to the reference ground potential connection 6 or the ground connection and are used to adjust the frequency of the resonant circuit formed by the crystal oscillator circuit. This normally results in an undesirable shift in the operating point of the circuit, in particular of the quick-response amplifier 3, which endangers stability. The quick-response amplifier 3 in the present example is in the form of a CMOS inverter. The relatively smaller compensation capacitor 10 is switched in the opposite sense, but in mirror-image form to the capacitors 5, 8 that govern the frequency of the resonant circuit. The compensation capacitor 10 has a fixed capacitor ratio with respect to the capacitors 5, 8 that govern the resonant circuit. The capacitors 5, 8 have the same capacitor value. Since the compensation capacitor 10 has a smaller capacitor value, and furthermore, is decoupled via the resistor 2 that is used to adjust the operating point of the inverter 3, it has only a very minor influence on the oscillation frequency, but has a considerable influence on the dynamic operating point. In the present example, the capacitive components 5, 8 which govern the oscillation frequency each have a capacitor value of 32 Pico farads, while the capacitor value of the compensation capacitor 10 is between 3 and 4 Pico farads and is accordingly less by a factor of 10 than the capacitor values of the first and second capacitive components 5, 8.

The compensation capacitor 10, which is driven in the opposite sense and in mirror-image form with respect to the capacitive components 5, 8, maintains the stability and drive range of the oscillator. This is advantageous, for example, when additional amplitude or frequency modulation is provided in the crystal oscillator circuit.

Figure 2:
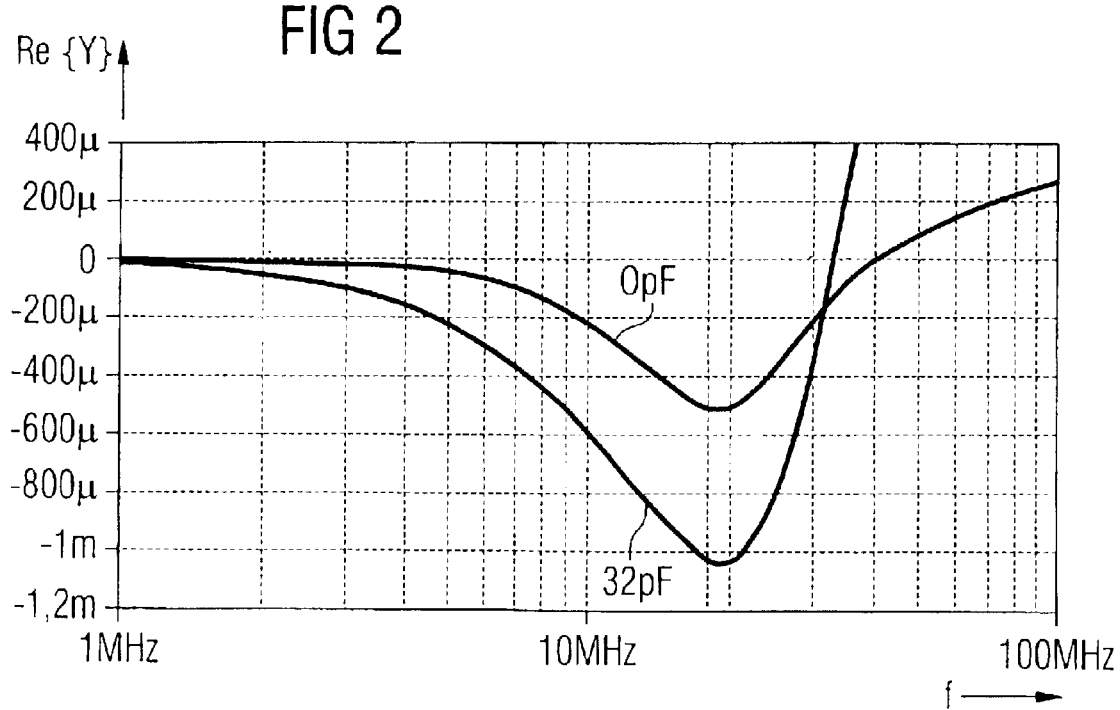
FIG. 2 is an S-parameter diagram illustrating the compensation for operating point shifts in the crystal oscillator circuit based on the real part of the input admittance, plotted against the frequency.

FIG. 2 is a graph with a logarithmic/linear representation to show the real part of the input admittance of the crystal oscillator, plotted against its frequency. As can be seen, irrespective of whether the capacitors 5, 8 with the capacitor value of 32 Pico farads are or are not connected, the same operating point is in each case maintained for the operating frequency of the crystal. This is achieved by connecting and disconnecting the compensation capacitor 10 in the opposite sense and in mirror-image form, as explained with reference to the circuit diagram shown in FIG. 1.

Figure 3:
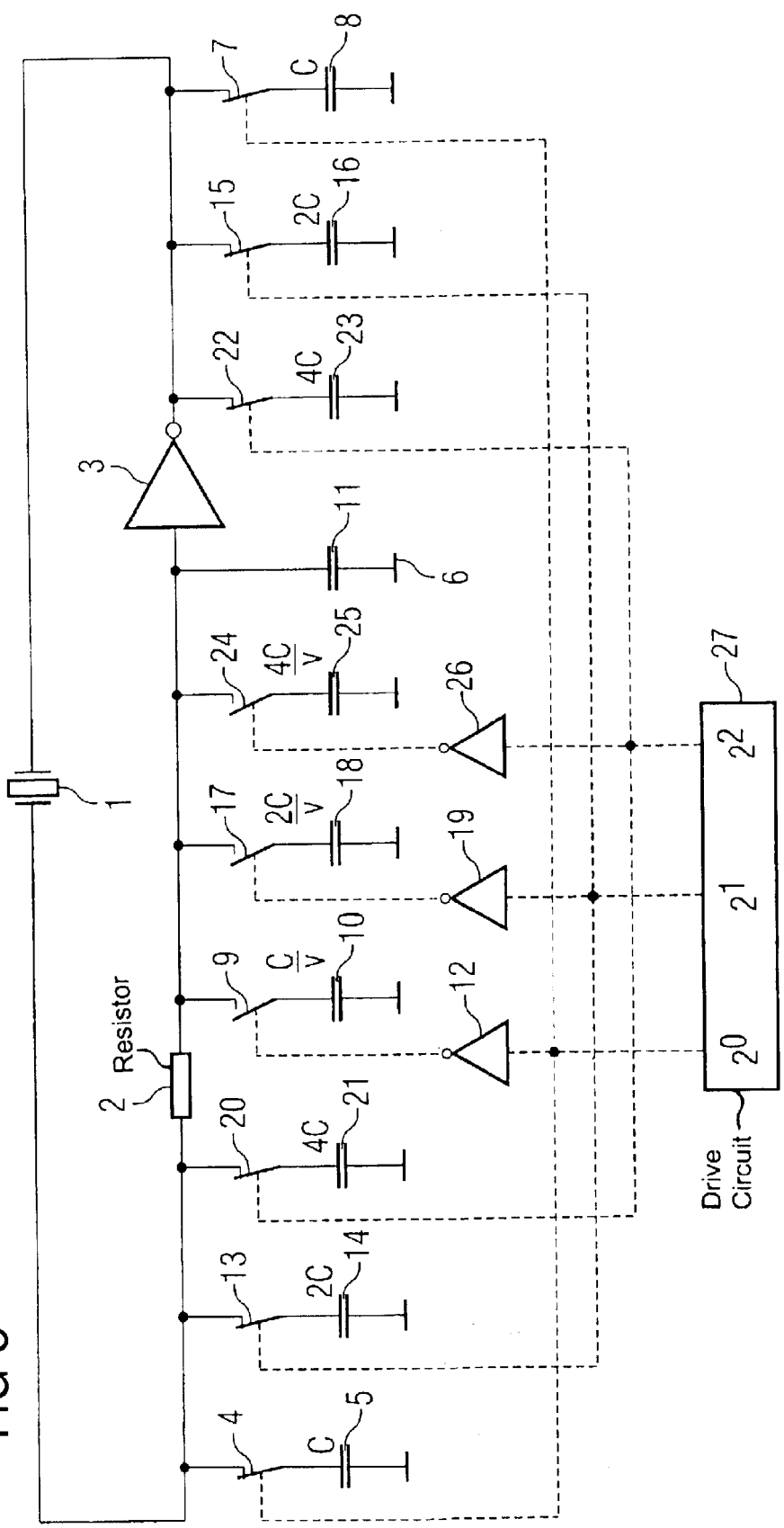
FIG. 3 shows a development of the crystal oscillator circuit shown in FIG. 1, in which an oscillation frequency can be adjusted discretely in a number of steps.

FIG. 3 shows a development of the crystal oscillator circuit shown in FIG. 1, in which the oscillation frequency of the crystal oscillator can be switched between two discrete frequencies and a large number of discrete oscillation frequencies can also be selected. This is accomplished by providing a number of pairs of capacitive components 5, 8; 14, 16; 21, 23, each of which has an associated compensation capacitor 10, 18, 25.

The design and method of operation of the crystal oscillator circuit shown in FIG. 3 corresponds largely to the crystal oscillator circuit shown in FIG. 1 and includes all the components that are shown there, with the same advantageous interconnection between them. To this extent, the description of FIG. 3 will not be repeated at this point.

In addition to the components that are shown in the crystal oscillator circuit shown in FIG. 1, the crystal oscillator circuit shown in FIG. 3 has further series circuits including in each case a respective switch 13 or 20 and a respective capacitor 14 or 21 (each defining another first capacitive component), which are connected in parallel with the series circuit formed by the switch 4 and the first capacitor 5. Two further series circuits, each including a respective switch 15 or 22 and a respective capacitor 16 or 23 (each defining another second capacitive component), are also connected in parallel with the series circuit formed by the switch 7 and the second capacitor 8 and are symmetrically connected with respect to the series circuits formed by the capacitor-switch pairs 13, 14, and 20, 21. In addition, further series circuits which each include a respective switch 17 or 24 and a respective compensation capacitor 18 or 25 are also provided in parallel with the compensation capacitor 10, which forms a series circuit together with the switch 9 that is associated with it, and these further series circuits are connected in parallel with the series circuit formed by the switch 9 and the compensation capacitor 10. Inverters 19 and 26 are respectively also provided for driving the switches 17 and 24 that are connected to the further compensation capacitors 18 and 25, in an analogous manner to the driving of the compensation capacitor 10 using the switch 9 and the inverter 12.

In the same way as the capacitors 5, 8 that form a pair that is driven jointly and at the same time, the capacitors 14, 16 and 21, 23 also each form a jointly driven pair of capacitors.

The first and second capacitive components 5, 8; 14, 16; 21, 23 are graduated in binary form, in pairs, with respect to one another. In a corresponding way, the associated compensation capacitors 10, 18, 25 are also graduated in binary form, with respect to one another, such that the capacitor ratio V of the first or second capacitor 5, 8; 14, 16; 21, 23 to the associated compensation capacitor 10, 18, 25 is always the same. In the present case, this capacitor ratio V is approximately 10.

The drive circuit 27 controls the connection and disconnection of the first and second capacitive components 5, 8; 14, 16; 21, 23 and of the compensation capacitors 10, 18, 25. If, for example, the pair of capacitors 5, 8 is disconnected by the switches 4, 7, by opening the switches, the compensation capacitor 10 which is associated with these capacitors is connected at the same time by closing the switch 9. In a corresponding manner, the pair of capacitors 14, 16 are driven in the opposite sense and in mirror-image form to the compensation capacitor 18 which is associated with them, and finally, the pair of capacitors 21, 23 are driven in a corresponding manner in the opposite sense and in mirror-image form to the compensation capacitor 25 which is associated with this pair of capacitors. The capacitors 5, 8; 14, 16; 21, 23, which govern the frequency, are provided symmetrically with respect to one another and are graduated in binary form to allow discrete adjustment of the resonant circuit frequency in a very exact manner with little complexity. The respectively associated compensation capacitors 10, 18, 25, which are each connected in the opposite sense, result in always maintaining the operating point of the crystal oscillator circuit irrespective of the choice of the capacitors that determine the frequency. The circuit may, of course, also be extended to any desired number of further switchable capacitors, based on the principle described above.

As an alternative to the described binary graduation, the capacitors may also, by way of example, all be of the same size.

In addition to the described embodiment having in each case three parallel-connected capacitor branches that can be connected and disconnected independently of one another, it is also possible according to the present principle to provide any desired number of further switchable branches.

I claim:

1. A crystal oscillator circuit, comprising:
    an oscillating crystal having a first and a second connection;
    a deattenuation amplifier having an input connected to said first connection of said oscillating crystal and an output connected to said second connection of said oscillating crystal;
    a device for operating point adjustment, said device coupling said oscillating crystal to said input of said quick-response amplifier;
    a reference node;
    a first capacitive component for connecting said first connection of said oscillating crystal to said reference node, said first capacitive component having a plurality of capacitive components connected in parallel;
    a second capacitive component for connecting said second connection of said oscillating crystal to said reference node, said second capacitive component having a plurality of capacitive components connected in parallel; and
    a compensation capacitor connected to said input of said deattenuation amplifier and to said reference node, said compensation capacitor having a plurality of capacitive components connected in parallel;
    said plurality of said capacitive components of said first capacitive component and said plurality of said capacitive components of said second capacitive component being connectable and disconnectable in pairs independently of one another;
    each one of said plurality of said capacitive components of said first capacitive component being associated with a respective one of said plurality of said capacitive components of said compensation capacitor;
    at least one capacitive component selected from a group consisting of said first capacitive component and said second capacitive component being adjustable; and
    said compensation capacitor being adjustable in a complementary manner to said first capacitive component and said second capacitive component.

2. The crystal oscillator circuit according to claim 1, wherein said device for operating point adjustment is a resistor.

3. The crystal oscillator circuit according to claim 1, wherein each one of said plurality of said capacitive components of said first capacitive component and said respective one of said plurality of said capacitive components of said compensation capacitor associated therewith has a fixed capacitance ratio.

4. The crystal oscillator circuit according to claim 1, wherein said plurality of said capacitive components of said compensation capacitor can be connected and disconnected independently of one another.

5. The crystal oscillator circuit according to claim 1, comprising:
    a plurality of switches; and
    a drive circuit;
    each one of said plurality of said capacitive components of said first capacitive component, said plurality of said capacitive components of said second capacitive component, and said plurality of said capacitive components of said compensation capacitor being coupled to a respective one of said plurality of said switches enabling connection and disconnection thereof;
    each one of said plurality of said switches having a control connection;
    said drive circuit supplying control signals in a non-inverted form to said control connections of ones of said plurality of said switches connected to said plurality of said capacitive components of said first capacitive component;
    said drive circuit supplying control signals in a non-inverted form to said control connections of ones of said plurality of said switches connected to said plurality of said capacitive components of said second capacitive component; and
    said drive circuit supplying control signals in an inverted form to said control connections of ones of said plurality of said switches connected to said plurality of said capacitive components of said compensation capacitor.

6. The crystal oscillator circuit according to claim 1, wherein:
    said first capacitive component has a capacitance value;
    said compensation capacitor has a capacitance value; and
    a quotient of said capacitance value of said first capacitive component and said capacitance value of said compensation capacitor is greater than 5.

7. The crystal oscillator circuit according to claim 1, comprising a minimum value capacitor permanently connecting said input of said deattenuation amplifier to said reference node.

8. The crystal oscillator circuit according to claim 1, wherein said deattenuation amplifier is an inverter.

9. The crystal oscillator circuit according to claim 1, wherein said deattenuation amplifier is a CMOS inverter.

* * * * *